United States Patent
Glaser et al.

(10) Patent No.: US 10,218,353 B2
(45) Date of Patent: Feb. 26, 2019

(54) LOW DISTORTION RF SWITCH

(71) Applicant: Efficient Power Conversion Corporation, El Segundo, CA (US)

(72) Inventors: John S. Glaser, Niskayuna, NY (US); David C. Reusch, Blacksburg, VA (US); Michael A. de Rooij, Playa Vista, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 15/861,183

(22) Filed: Jan. 3, 2018

(65) Prior Publication Data

US 2018/0191344 A1 Jul. 5, 2018

Related U.S. Application Data

(60) Provisional application No. 62/441,769, filed on Jan. 3, 2017.

(51) Int. Cl.
  *H03K 17/16* (2006.01)
  *H03K 17/687* (2006.01)
  *H03K 17/693* (2006.01)

(52) U.S. Cl.
  CPC ....... *H03K 17/6874* (2013.01); *H03K 17/162* (2013.01); *H03K 17/693* (2013.01); *H03K 2217/0054* (2013.01)

(58) Field of Classification Search
  CPC . H03K 17/161; H03K 17/162; H03K 17/6874
  USPC .......................... 327/365, 379, 382, 384, 389
  See application file for complete search history.

(56) References Cited

U.S. PATENT DOCUMENTS

| | | | |
|---|---|---|---|
| 5,926,093 A | 7/1999 | Bowers et al. | |
| 2004/0235549 A1* | 11/2004 | Struble | H01P 1/15 463/16 |
| 2012/0092074 A1 | 4/2012 | Yanduru et al. | |
| 2012/0262217 A1* | 10/2012 | Gorbachov | H01P 1/15 327/382 |
| 2014/0011463 A1 | 1/2014 | Madan et al. | |
| 2014/0062577 A1 | 3/2014 | Chih-Sheng | |
| 2015/0070075 A1* | 3/2015 | Keane | H03K 17/693 327/389 |

* cited by examiner

*Primary Examiner* — William Hernandez
(74) *Attorney, Agent, or Firm* — Blank Rome LLP

(57) ABSTRACT

A circuit for an RF switch using FET transistors that largely cancels the non-linearity of the $C_{oss}$ of the FETs over a majority of the signal range, and reduces distortion. The RF switch includes two substantially identical FETs. The source of one FET is connected to the drain of the other FET and the node formed comprises one terminal of the switch. Two substantially identical capacitors are connected in series with each other and in parallel with the FETs, and the node thus formed comprises the second terminal of the switch. The capacitors are selected such that they have negligible impedance at AC frequencies for which the switch is expected be used, and in particular a much lower impedance than $C_{oss}$ of each FET. A voltage source with a series impedance is also connected in parallel with the capacitors and the two FETs.

9 Claims, 8 Drawing Sheets

LOW DISTORTION RF SWITCH

This application claims the benefit of U.S. Provisional Application No. 62/441,769, filed on Jan. 3, 2017, the disclosure of which is incorporated herein.

BACKGROUND OF THE INVENTION

Electronically controlled radio frequency (RF) switches, or transmission gates, are commonly used in a wide variety of RF systems. Applications include adaptive tuning of filters or resonant circuits using reactive components or transmit/receive (T/R) switches to allow an antenna to be connected to various transmitters or receivers.

RF switches are designed to pass RF signals while in an on state, and block RF signals while in an off state. RF switches are controlled by a direct current (DC) signal or signals. Some RF switch technologies include PIN diodes, conventional electromechanical relays, micro-electromechanical systems (MEMS) relays, and field-effect transistors (FETs). Each of these technologies offer several advantages and disadvantages.

PIN diode RF switches are advantageous in that they are all-electronic, fast, and are high RF power-capable. However, they are expensive and require high drive power, complex control, and complex bias networks to separate control and RF.

Conventional relays are robust, very high RF power-capable, simple to control, do not require bias networks, and have low RF parasitics. However, they are slow, expensive, physically large, and having a limited operational life.

MEMS relays are small in size, have low RF parasitics, and can be integrated. However, they have limited RF power capability, poor robustness to electrical stress, require complex control, have unusual control signal requirements (voltage and current), are expensive, and have a limited lifetime.

FETs are small and can be easily integrated, require low control power, have fast operation, are all-electronic, and are high RF power-capable. However, they may require bias networks to separate control and RF, and have a relatively high off-state capacitance (low isolation) and non-linear off-state capacitance (harmonic generation, tuning difficulty).

An FET RF switch that overcomes some of the disadvantages of the FET RF switches currently available would be highly desirable. Accordingly, a solution to the problem of non-linear capacitance and tuning difficulties in currently available FET RF switches is needed.

SUMMARY OF THE INVENTION

The present invention solves the above-noted problem in the prior art by providing a low distortion RF switch as described and claimed herein.

DETAILED DESCRIPTION OF THE INVENTION

Output capacitance ($C_{oss}$) in FET switches causes undesired parasitic capacitance across switch nodes. $C_{oss}$ reduces off-state isolation and, for a given FET technology, smaller $C_{oss}$ can be achieved by a reduction in the size of the FET, but this increases on-state resistance and on-state loss. GaN FETs provide advantageous characteristics over silicon MOSFETs, because GaN semiconductor technology results in a lower value of $C_{oss}$ for a given on-state resistance, which can greatly improve RF switch performance.

The non-linearity of $C_{oss}$ in known FET RF switches causes significant problems. For example, non-linearity of $C_{oss}$ generates harmonic distortion, and the capacitance changes with the signal level, causing a degradation of isolation and performance in tuned or resonant circuits.

$C_{oss}$ can be tuned out with a parallel inductor for narrow-band switches to improve isolation. Two FETs can be used to make non-linearity symmetrical and reduce even harmonic distortion, as well as allowing bidirectional current flow.

Figure 1:
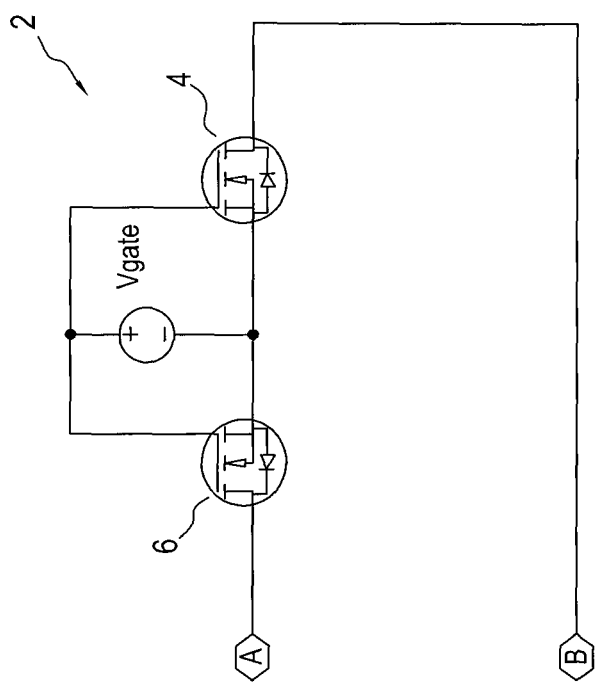
FIG. 1 is a schematic of a typical prior art RF switch.

FIG. 1 depicts a schematic of a typical prior art RF switch 2 using two substantially identical FETs 4 and 6, where A and B form the two terminals of the switch through which an AC current is blocked when the switch is in the off-state and allowed to pass when the switch is in the on-state. The FETs 4, 6 are connected such the sources of the two FETs are connected to each other and the gates of the two FETs are connected to each other. Terminal A is connected to the drain terminal of the first FET and terminal B is connected to the drain of the second FET. The RF switch of FIG. 1 has an off-state capacitance $C_{off}$ due to the parasitic output (drain to source) capacitance of the FETs, that reduces the off-state impedance and thus the ability of the switch to block an AC current, and typically this is compensated for by the use of a parallel resonant inductor or similar well-known means. For typical FETs, $C_{off}$ is highly non-linear, which results from the non-linearity of $C_{oss}$ of the FETs.

Figure 2:
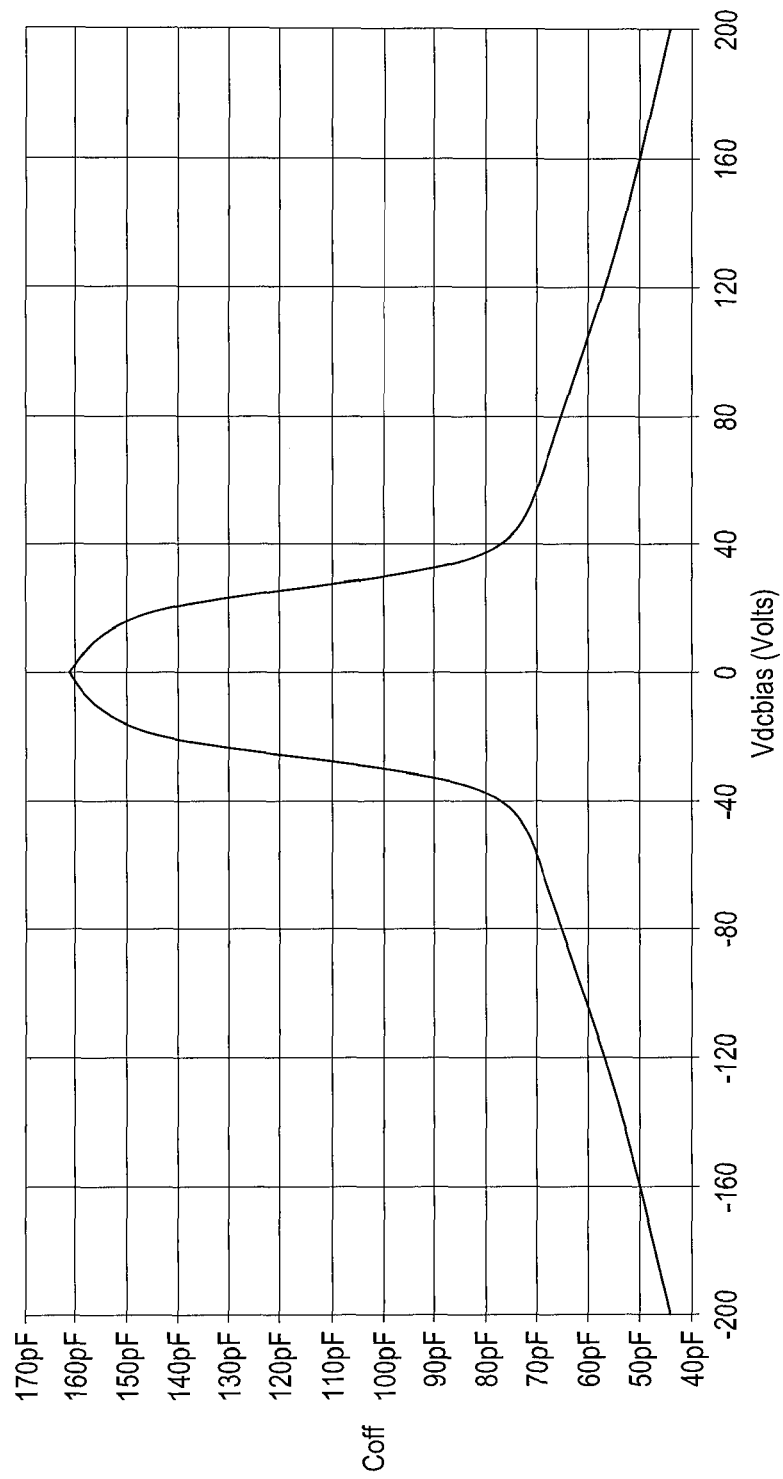
FIG. 2 is a graph of the off-state small-signal capacitance of the RF switch of FIG. 1, across a range of DC bias voltages.

FIG. 2 illustrates the small-signal value of $C_{off}$ across a range of DC bias voltages, showing large changes in capacitance as the DC bias voltage is varied, due to the non-linear output capacitance of the FETs. Implementation of the RF switch of FIG. 1 with typical semiconductor FETs will result in the switch having the greatest capacitance non-linearity around zero volts of DC bias, which will be the mean of the AC signal that is gated by the switch. This large non-linearity will generate harmonic distortion of the AC signal. It also presents an effective capacitance that varies with signal level, greatly reducing the effectiveness of using a parallel resonant inductor to improve isolation or other means of compensating for $C_{off}$. The non-linearity can only be avoided for AC signals by limiting the amplitude of the AC signal to a small fraction of the voltage rating of the FET voltage rating, and this greatly reduces the utility of the RF switch. A typical fraction would be <10% for common FETs.

Figure 3:
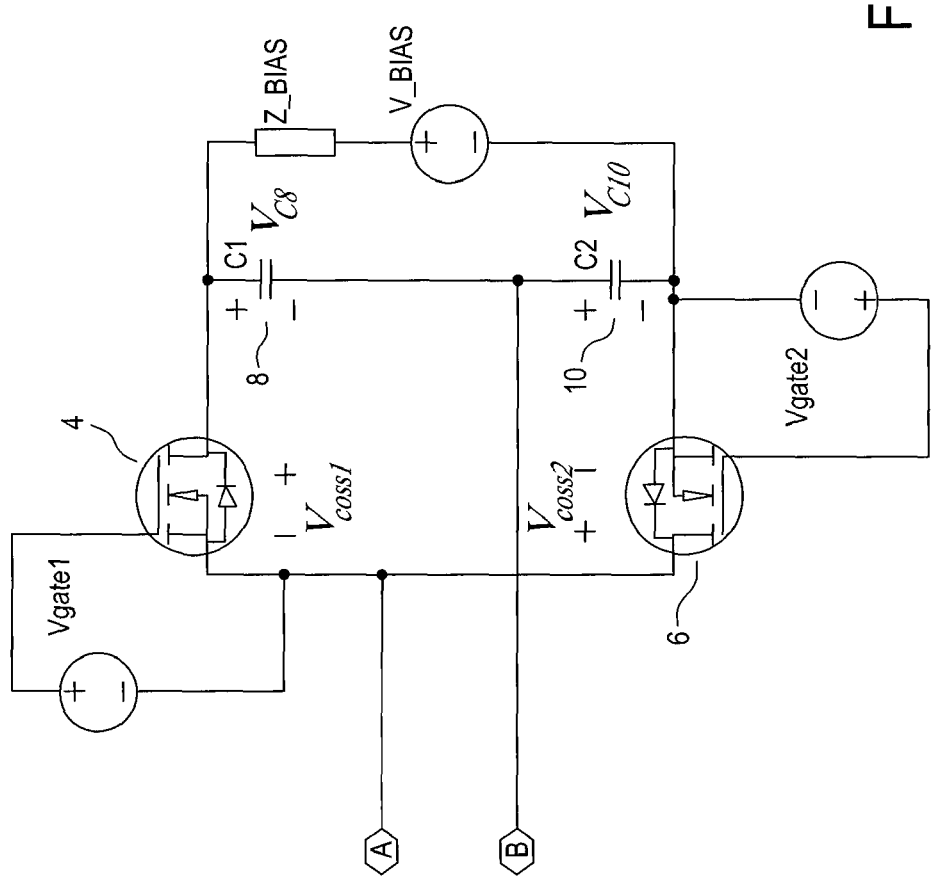
FIG. 3 is a schematic of an RF switch according to an embodiment of the present invention.

FIG. 3 depicts a schematic of the present invention. The RF switch uses two substantially identical FETs 4, 6, where A and B form the two terminals of the switch through which an AC current is blocked when the switch is in the off-state and allowed to pass when the switch is in the on-state. The source of FET 4 is connected to the drain of FET 6 and the node formed also comprises terminal A of the switch. Two substantially identical capacitors 8 and 10 are connected in series and the node thus formed between the capacitors also comprises terminal B. The terminal of capacitor 8 which is not connected to terminal B, is connected to the drain of FET 4, and the terminal of capacitor 10 which is not connected to terminal B, is connected to the source of FET 6. Capacitors 8 and 10 are selected such that they have negligible impedance at AC frequencies for which the switch is expected be used, and in particular a much lower impedance than the maximum $C_{oss}$ value of each FET. A voltage source $V_{dcbias}$ with a series impedance $Z_{dcbias}$ is connected from the drain of FET 4 to the source of FET 6. A means of applying a controlled gate voltage from the gate to source of FET 4 and FET 6, such that FETs 4 and 6 can be turned on or off, is also present.

In a preferred embodiment of the invention, the FETs 4 and 6 are gallium nitride FETs.

In one implementation, the value of $V_{dcbias}$ is held substantially constant whether the switch is on or off, with the value of the bias in the range of >0 V to ≤$2V_{max}$, where $V_{max}$ is the maximum voltage rating of FET 4 or FET 6. For typical semiconductors comprising FETs 4 and 6, a larger value of $V_{dcbias}$ will advantageously result in a lower off-state value of $C_{oss}$. To permit an AC current to pass between terminals A and B, the RF switch is turned on by applying the appropriate gate to source voltage to each of FETs 4 and 6 such that they are each turned on. To substantially prohibit an AC current from passing between terminals A and B, the RF switch is turned off by applying the appropriate gate to source voltage to each of FET 4 and FET 6 such that they are each turned off. When the RF switch is on, an AC current can flow through the low AC impedance comprising the branch formed by capacitor 8 and FET 4 in parallel with the branch formed by capacitor 10 and FET 6.

The impedance $Z_{dcbias}$ is a network that may have a large enough impedance at DC and low frequencies to limit DC current from the source and through FET 4 and FET 6 while the RF switch is on, advantageously reducing power dissipation. When the RF switch is turned off, FET 4 and FET 6 present a high impedance to DC, which is much higher than $Z_{dcbias}$, hence the voltage $V_{dcbias}$ is applied to FET 4 and FET 6 in series, and FET 4 and FET 6 will each see approximately $V_{dcbias}/2$ from drain to source, i.e. $C_{oss1}$ and $C_{oss2}$ will each be charged to $V_{dcbias}/2$. Capacitor 8 and capacitor 10 will each be charged to $V_{dcbias}/2$. Since typical FETs have a $C_{oss}$ that is a decreasing function of voltage, this will result in each FET having a low value of $C_{oss}$. The presence of a voltage from A to B, denoted by AB, will produce very small variation on the voltages on capacitor 8 and capacitor 10 due to the low impedance in the range of interest, i.e. the AC portion $V_{C8}$ and $V_{C10}$ both approximate 0. Then, $$v_{Coss1} \cong \frac{V_{BIAS}}{2} - v_{AB} \text{ and } v_{Coss2} \cong \frac{V_{BIAS}}{2} + v_{AB}$$

Since $C_{oss}$ is a decreasing function of voltage, as $V_{AB}$ changes, the values of $C_{oss1}$ and $C_{oss2}$ change in opposite directions. The total capacitance between A and B is $C_{oss1}+C_{oss2}=C_{off}$, so the opposing variation in $C_{oss1}$ and $C_{oss2}$ reduces the variation in $C_{off}$ as a function of voltage, thus making it more linear. Furthermore, for typical FETs, the largest capacitance and the largest nonlinearity occur for small values of $V_{Coss}$, but, advantageously, this only occurs for $|v_{AB}|$ approaching $V_{dcbias}/2$. The present invention pushes the highly non-linear portion of the $C_{oss}$ of each FET to the edge of the operating range. The non-linear portion can be avoided by assigning a maximum permissible signal amplitude. In the present invention, this amplitude can be a large fraction of the FETs voltage rating. A typical fraction would be >50%, and could be substantially higher depending upon the application.

Figure 4:
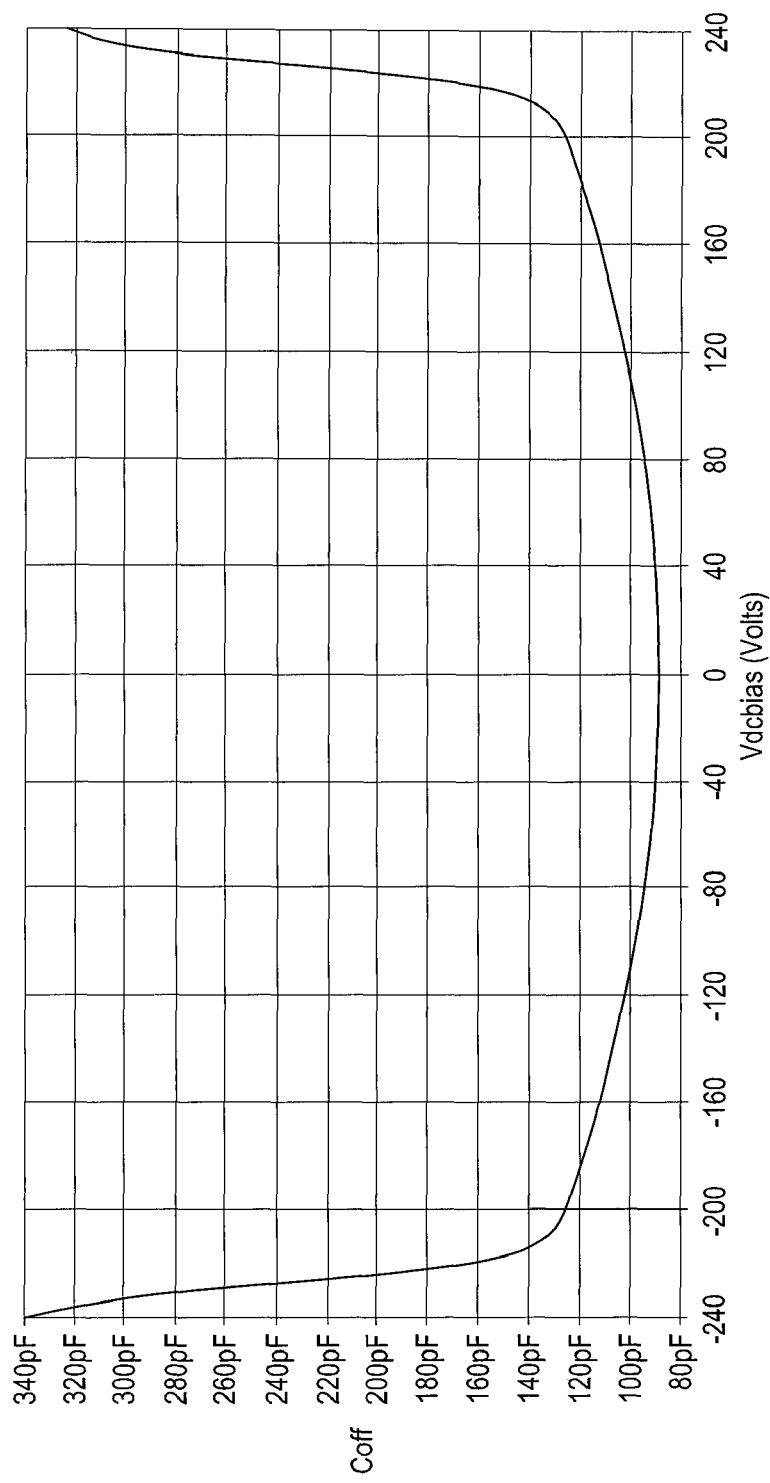
FIG. 4 is a graph of the off-state small-signal capacitance of the RF switch of FIG. 3, across a range of DC bias voltages.

The present invention thus largely cancels the non-linearity of $C_{oss}$ over a majority of the signal range. The RF switch therefore allows tuning out of $C_{oss}$ over a large amplitude range, and reduces distortion. FIG. 4 depicts the small-signal $C_{off}$ of the RF switch of FIG. 3, across a range of bias voltages.

Figure 5:
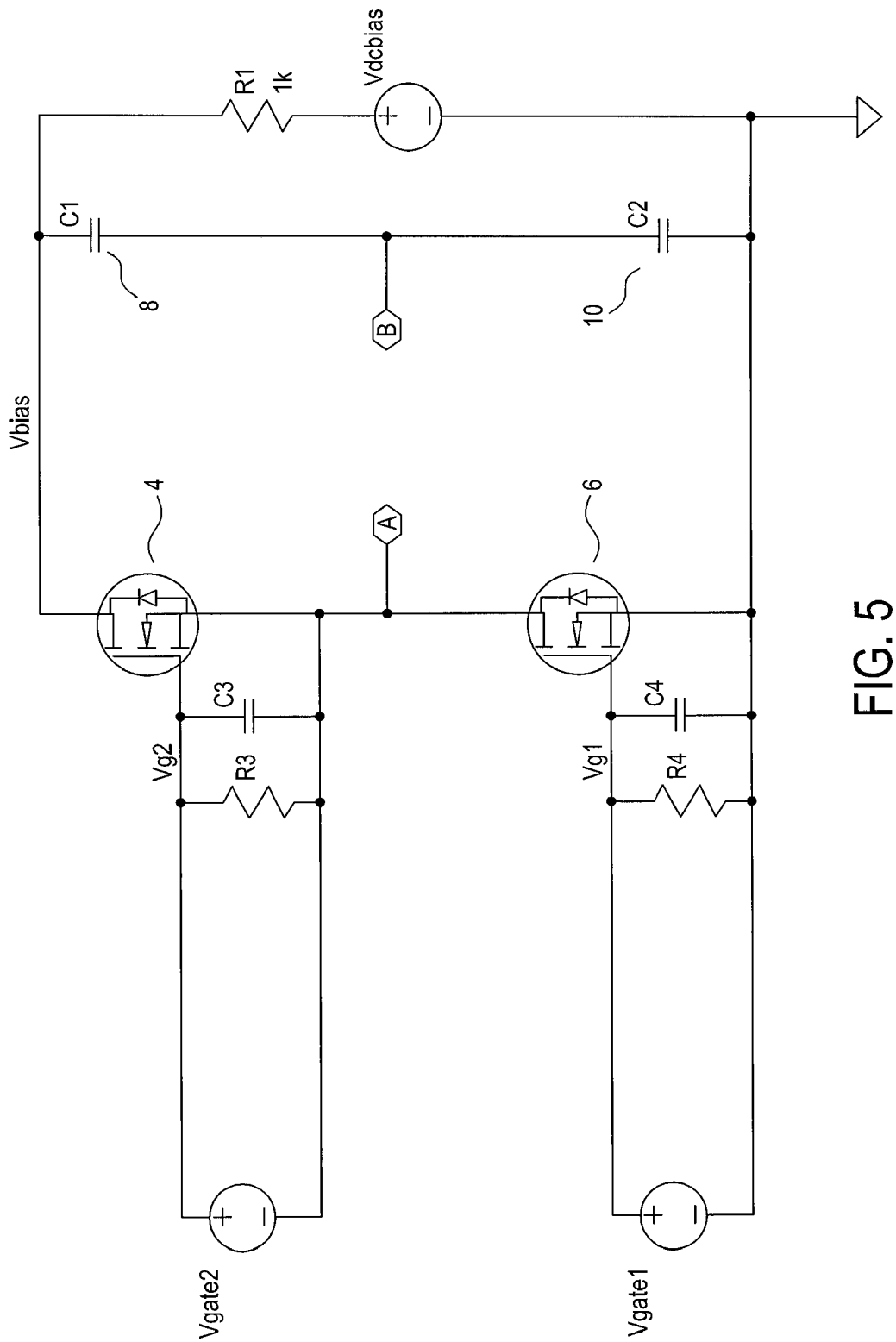
FIG. 5 is a schematic of a drive scheme according to an embodiment of the present invention.
Figure 6:
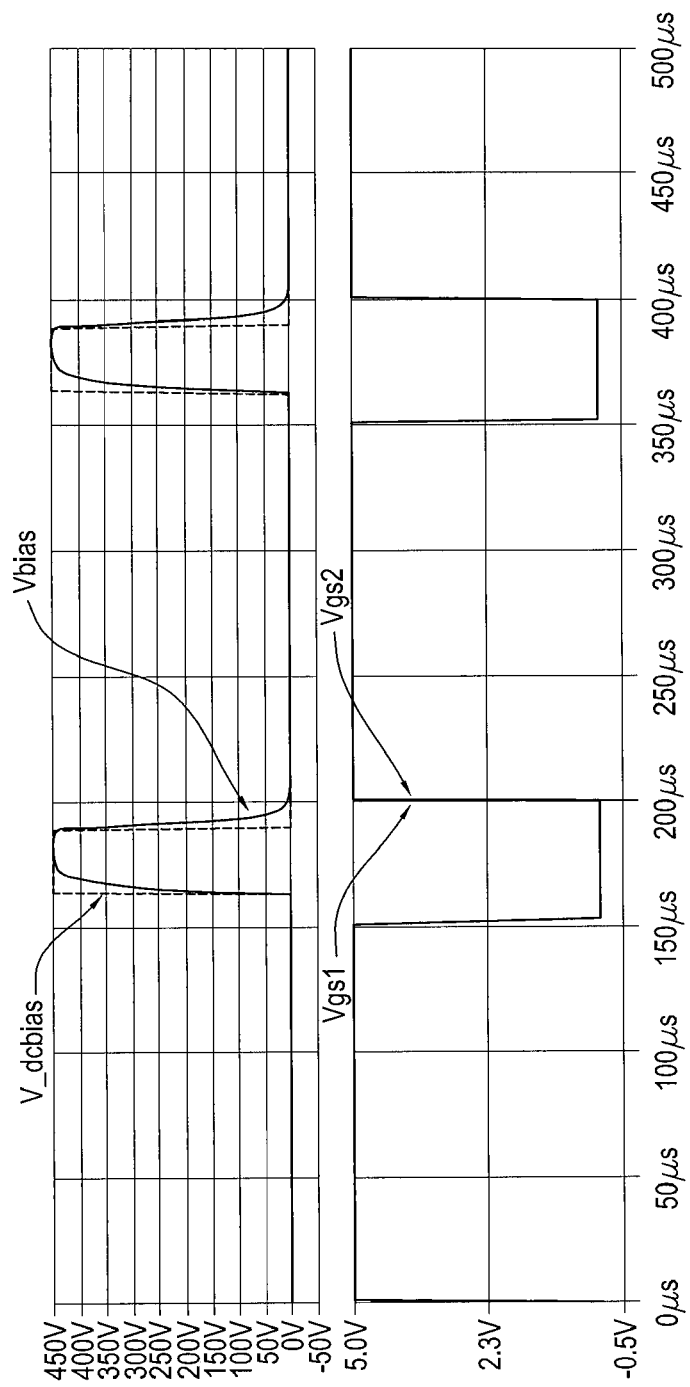
FIG. 6 is a graph of voltages of the drive scheme of FIG. 5, according to an embodiment of the present invention.

In another implementation of this invention, shown in FIG. 5 (corresponding waveforms shown in FIG. 6), a resistor R3 and a capacitor C3 are connected in parallel with the voltage source Vgate2 for switching the gate of FET 4, and a resistor R4 and capacitor C4 are likewise connected in parallel with the voltage source Vgate1 for driving the gate of FET 6. Resistors R3 and R4 allow the gate-source capacitance of the FETs to discharge, so that in the absence of a gate voltage, or if the gate voltage is <0, the FETs will turn in an interval following the removal of gate drive, the interval depending upon the FET gate-source capacitance and the value of R3 and R4. Capacitors C3 and C4 can be optionally used to increase the discharge time of the gates if that is desirable for a specific application. The bias voltage source Vdcbias can be switched between 0 and a DC value $V_{BIASON}$. Starting from the off state, the bias source is switched to zero prior to turning the FETs on. This allows the reduction of a current limiting impedance $Z_{bias}$ to the point where it could be replaced with a short or other low impedance network, while still preventing large currents from flowing when FET 4 and FET 6 are on. To turn the switch off, the gates of FET 4 and FET 6 are turned off, and afterwards the bias voltage is switched to a value $V_{bias}$.

Figure 7:
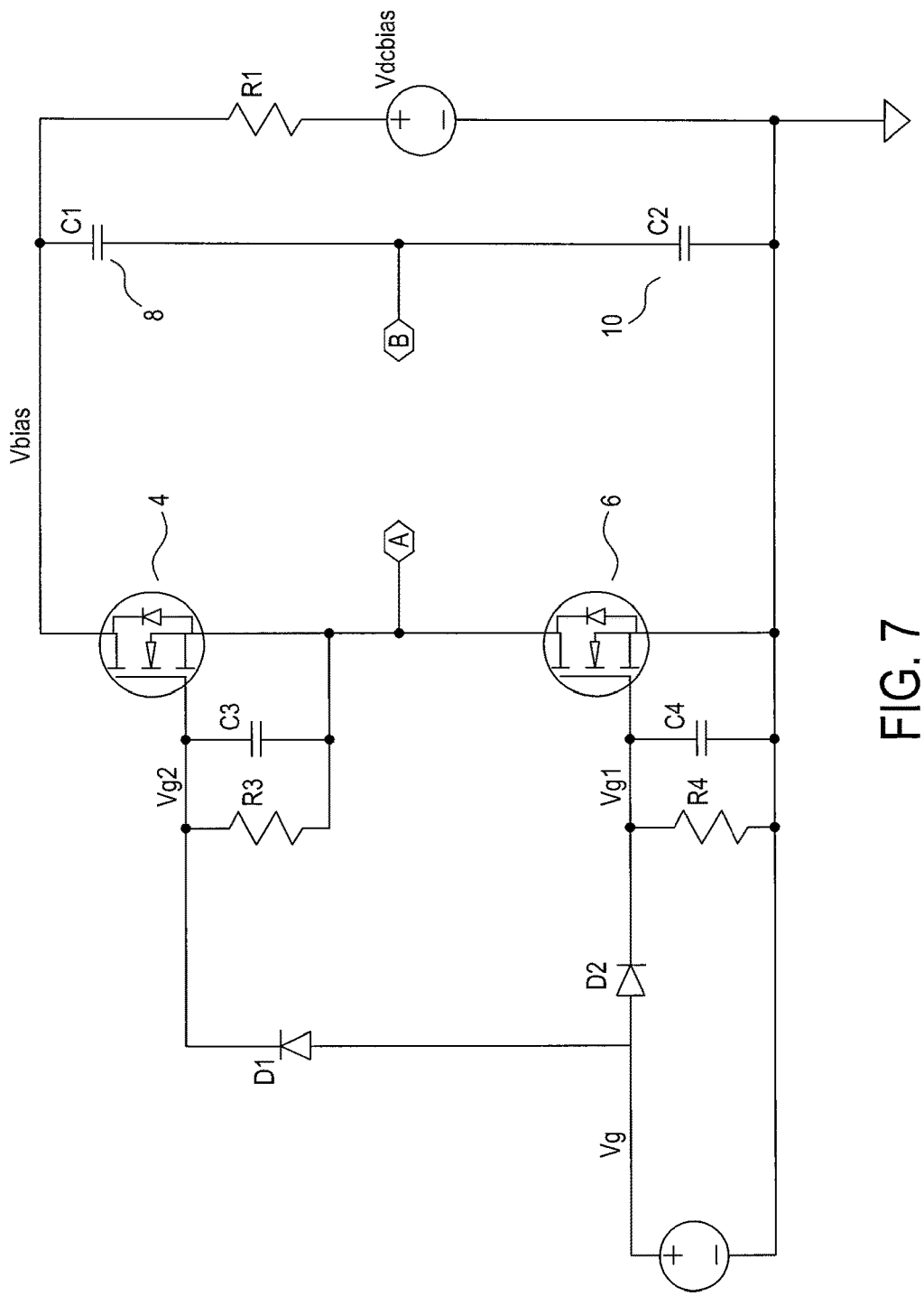
FIG. 7 is a schematic of another drive scheme according to an embodiment of the present invention.
Figure 8:
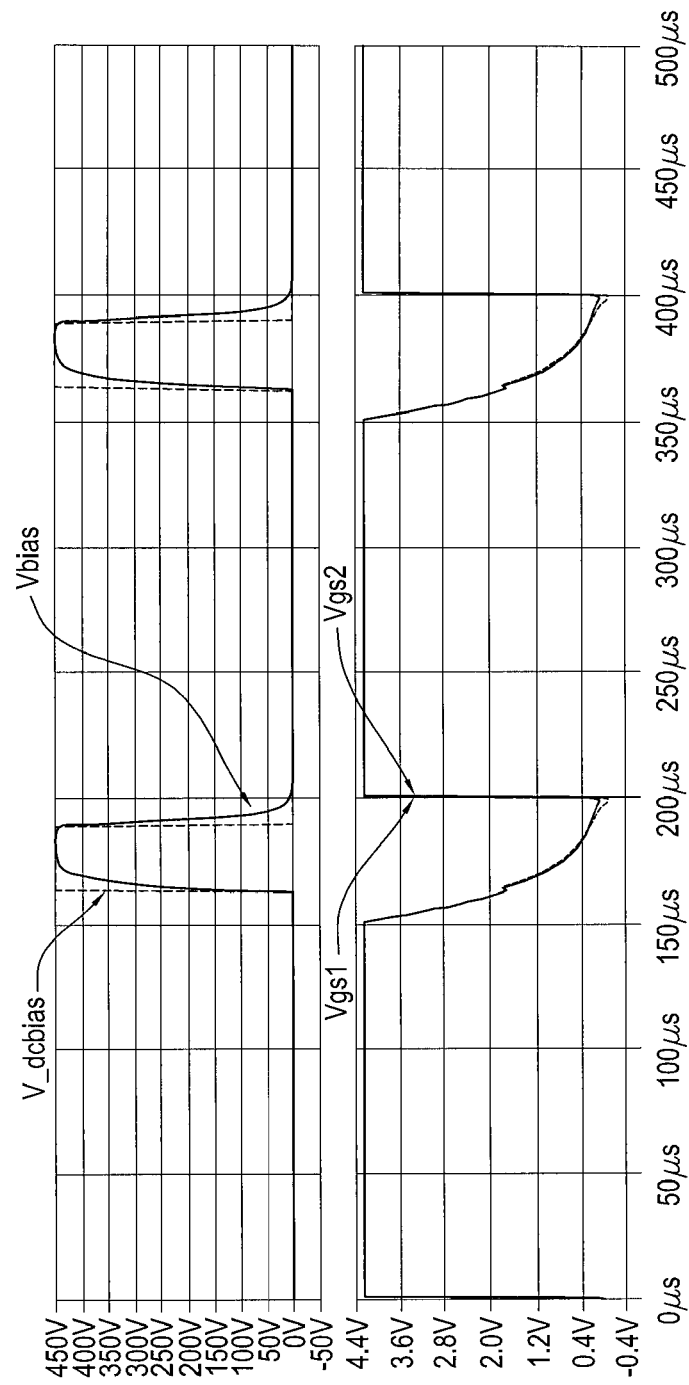
FIG. 8 a graph of voltages of the drive scheme of FIG. 7, according to an embodiment of the present invention.

In yet another implementation of this invention, shown in FIG. 7 (corresponding waveforms shown in FIG. 8), a single voltage source Vgate1 may be used to control the switch, and this single source may be advantageously connected to the same reference as the bias source Vdcbias. The connection of a diode D2 with the anode connected to the gate of FET 6 and the cathode to the gate of FET 4, and a resistor from gate to source of FET 4 means that, when a gate turn-on voltage is applied to FET 6 and FET 6 turns on, the source of FET 4 will be substantially at the same potential as the source of FET 6. Then, the diode can conduct, and allow the gate of FET 4 to be charged and turn on in addition to FET 6, thus turning on the RF switch. When the gate voltage is turned off, FET 6 will turn off, and the source and gate of FET 4 will increase. This will force the diode off, and now the resistor will discharge the gate of FET 4 turning it off.

Table 1, below, compares properties of the RF switch of the present invention to a single-FET switch and a prior art switch, where all FETs in Table 1 are assumed to have equal active area and the same device technology:

TABLE 1

| Property | Single FET | Prior Art Switch (2 back-to-back FETs) | New Switch (two FETs) |
|---|---|---|---|
| On-state AC resistance ($R_{on}$) | $RDS_{on}$ | $2RDS_{on}$ | $RDS_{on}/2$ |
| Off-state min capacitance ($C_{off}$) | $C_{ossmin}$ | $C_{ossmin}$ | $2C_{ossmin}$ |
| Max AC amplitude to avoid exceeding device rating | $VDS_{max}/2$ | $VDS_{max}$ | $VDS_{max}$ (but may need voltage balancing resistors in place) |
| Off-state max capacitance with reduced voltage swing | Can be small | $C_{ossmax}$ | Can be small, but 2x single die |
| Biasing required | Yes, ~$VDS_{max}$ | No | Yes, ~$2VDS_{max}$ |

For the present invention, the minimum capacitance looks larger, but $R_{on}$ is two times smaller. The size of the FET active area can therefore be reduced, increasing $R_{on}$ and decreasing $C_{off}$. As an example, reduction of FET active area by a factor of two may give a total active area, $R_{on}$, and $C_{oss}$ similar to the single FET switch.

The RF switch of the present invention has many applications. For example, the RF switch of the present invention can be used in magnetic resonance imaging devices. However, the RF switch of the present invention provides benefits for other applications as well, including any application needing a solid-state RF switch as part of a tuned network, especially where medium or high powers are needed.

The above description and drawings are only to be considered illustrative of a specific embodiment of the invention which achieves the features and advantages described herein. Modifications and substitutions to the invention can be made. Accordingly, the embodiment of the invention described herein is not considered as being limited by the foregoing description and drawings, but only by the appended claims.

The invention claimed is:

1. An RF switch, comprising:
   a first FET and a second FET, each FET having a drain, a source, a gate, and an output capacitance Coss, wherein the source of the first FET is connected to the drain of the second FET, and the connection of the first FET and the second FET comprises a first terminal of the switch;
   a first capacitor and a second capacitor connected in series, each capacitor having a first terminal and a second terminal, the first terminals of the first capacitor and the second capacitor being connected together, wherein the connection of the first and second capacitors comprises a second terminal of the switch, the second terminal of the first capacitor being connected to the drain of the first FET, and the second terminal of the second capacitor being connected to the source of the second FET, the first and second capacitors having a capacitance substantially lower than the Coss of the first and second FETs;
   a DC bias voltage source and a series impedance connected from the drain of the first FET to the source of the second FET in parallel with the first and second capacitors; and
   first and second voltage sources for applying a controlled gate voltage from the gate to the source of the first FET and the second FET, respectively;
   whereby the RF switch is turned on by applying, via the first and second voltage sources, an appropriate gate to source voltage to the first and second FETs, such that an AC current can flow in parallel through low-impedance first and second branches comprising, respectively, the first FET and the first capacitor, and the second FET and the second capacitor.

2. The RF switch as recited in claim 1, wherein the series impedance has a sufficiently large impedance at DC and low frequencies to limit DC current through the first and second FETs when the switch is on.

3. The RF switch as recited in claim 1, wherein the DC bias voltage source is held at a substantially constant value whether the switch is on or off.

4. The RF switch as recited in claim 1, wherein a resistor and a capacitor are connected in parallel with each of the first and second voltage sources, and the DC bias voltage source is switched to 0 volts in the off state of the first and second FETs, prior to turning the first and second FETs on, and then the DC bias voltage source is switched to a positive value $V_{BIASON}$ after the first and second FETs are switched off, to allow the first and second capacitors to charge.

5. The RF switch as recited in claim 1, wherein the first and second FETs are gallium nitride FETs.

6. An RF switch, comprising:
   a first FET and a second FET, each FET having a drain, a source, a gate, and an output capacitance Coss, wherein the source of the first FET is connected to the drain of the second FET, and the connection of the first FET and the second FET comprises a first terminal of the switch;
   a first capacitor and a second capacitor connected in series, each capacitor having a first terminal and a second terminal, the first terminals of the first capacitor and the second capacitor being connected together, wherein the connection of the first and second capacitors comprises a second terminal of the switch, the second terminal of the first capacitor being connected to the drain of the first FET, and the second terminal of the second capacitor being connected to the source of the second FET, the first and second capacitors having a capacitance substantially lower than the Coss of the first and second FETs;
   a DC bias voltage source and a series impedance connected from the drain of the first FET to the source of the second FET in parallel with the first and second capacitors; and
   a single voltage source for applying a controlled gate voltage from the gate to the source of the first FET and the second FET; and
   a resistor and a capacitor are connected in parallel with the gate and the source of each of the first and second FETs, and first and second diodes connected in series between the single voltage source and the first and second FETS, respectively;
   whereby the RF switch is turned on by applying, via the single voltage source, an appropriate gate to source voltage to the first and second FETs, such that an AC current can flow in parallel through low-impedance first and second branches comprising, respectively, the first FET and the first capacitor, and the second FET and the second capacitor.

7. The RF switch as recited in claim 6, wherein the series impedance has a sufficiently large impedance at DC and low frequencies to limit DC current through the first and second FETs when the switch is on.

8. The RF switch as recited in claim 6, wherein the single voltage source and the DC bias voltage source are connected to a single reference voltage.

9. The RF switch as recited in claim 6, wherein the first and second FETs are gallium nitride FETs.

* * * * *